United States Patent
Chen et al.

(10) Patent No.: US 6,277,721 B1
(45) Date of Patent: *Aug. 21, 2001

(54) SALICIDE FORMATION PROCESS

(75) Inventors: Tung-Po Chen, Taichung; Hong-Tsz Pan, Hsinchu Hsien; Wen-Yi Hsieh, Hsinchu, all of (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/467,005

(22) Filed: Dec. 20, 1999

Related U.S. Application Data

(63) Continuation of application No. 09/073,861, filed on May 7, 1998, now Pat. No. 6,022,795.
(60) Provisional application No. 60/051,702, filed on Jul. 3, 1997.

(51) Int. Cl.$^7$ ................ H01L 21/3205; H01L 21/4763; H01L 21/336
(52) U.S. Cl. ..................... 438/586; 438/592; 438/301
(58) Field of Search .................. 438/301, 592, 438/586, 296, 682

(56) References Cited

U.S. PATENT DOCUMENTS

| | | | |
|---|---|---|---|
| 5,451,545 | * 9/1995 | Ramasawami et al. | 438/586 |
| 5,731,239 | * 3/1998 | Wong et al. | 486/586 |
| 5,776,822 | * 7/1998 | Fujii et al. | 438/586 |
| 5,874,342 | * 2/1999 | Tsai et al. | 438/683 |
| 5,902,129 | * 5/1999 | Yoshikawa et al. | 438/592 |
| 6,022,795 | * 2/2000 | Chen et al. | 438/586 |

OTHER PUBLICATIONS

Wolf et al. "Silicon processing for the VSLI era, vol. 1: Process technology" p. 367 Jan. 1986.*

\* cited by examiner

*Primary Examiner*—John F. Niebling
*Assistant Examiner*—Walter L. Lindsay, Jr.
(74) *Attorney, Agent, or Firm*—Rabin & Champagne, P.C.

(57) ABSTRACT

A method of making a semiconductor device including a MOS transistor provides an insulator formed on a semiconductor substrate and a gate electrode formed on the insulator. Source/drain regions are formed within the substrate on either side of the gate electrode. A layer of titanium is sputtered onto the semiconductor device, and a layer of titanium nitride is direct sputtered over the titanium layer using a titanium nitride target. The device is annealed at a first temperature to form a structure including titanium silicide on the polysilicon electrode, titanium silicide on the surface of the source/drain regions, unreacted titanium over the silicide regions, and titanium nitride over the unreacted metal The unreacted titanium and titanium nitride are removed from the structure, and the structure is annealed at a higher temperature than the first temperature to form a lower resistivity titanium silicide.

16 Claims, 7 Drawing Sheets

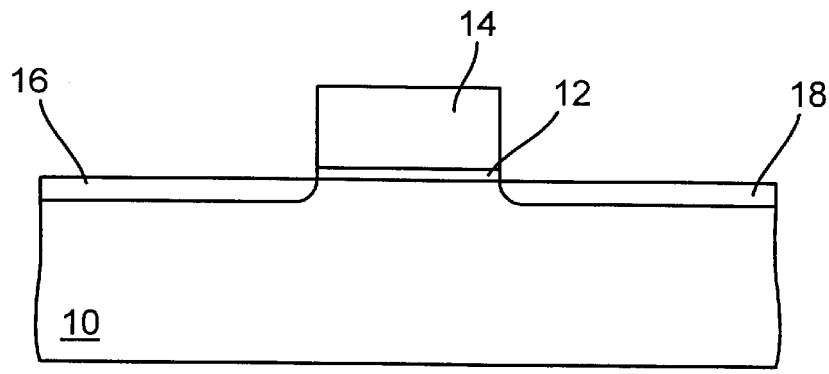
FIG. 1 – PRIOR ART
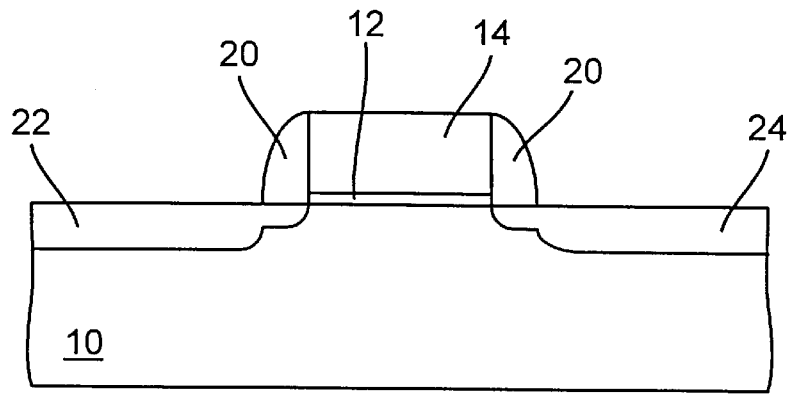
FIG. 2 – PRIOR ART
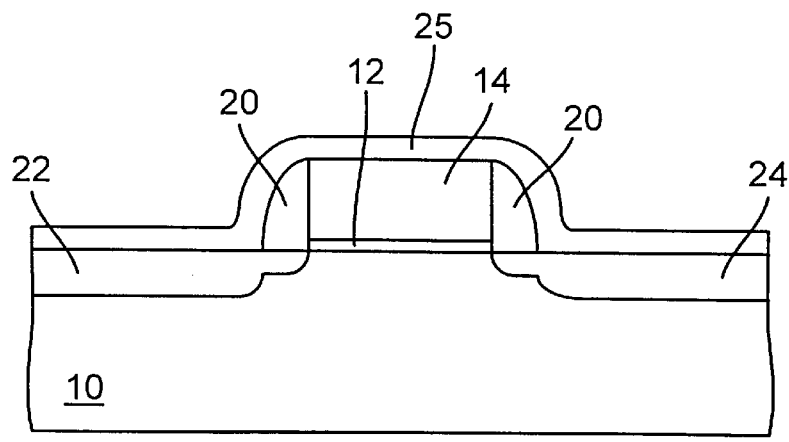
FIG. 3 – PRIOR ART

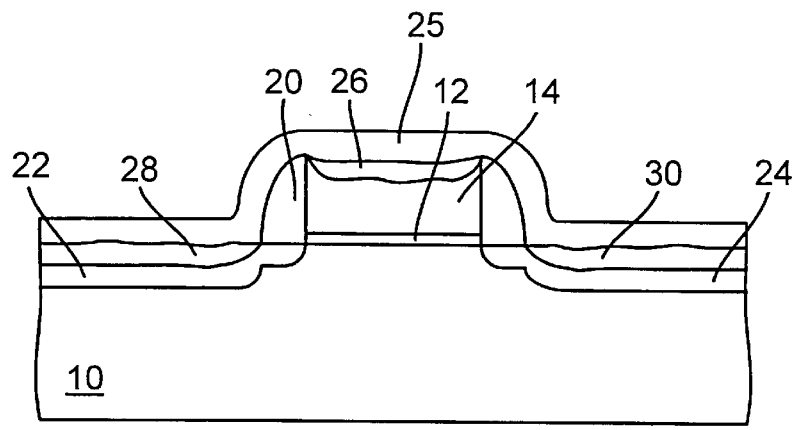
FIG. 4 - PRIOR ART
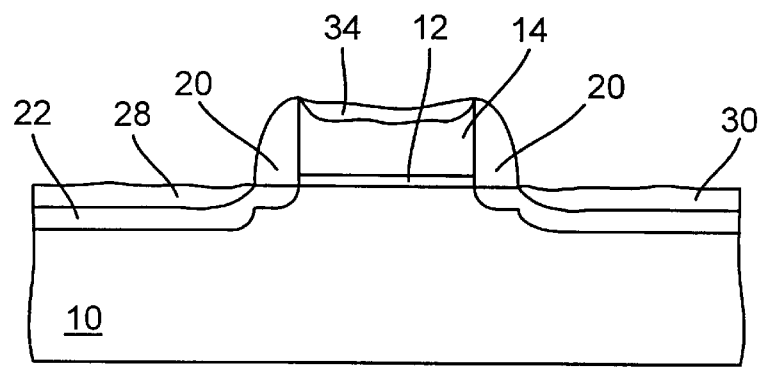
FIG. 5 - PRIOR ART
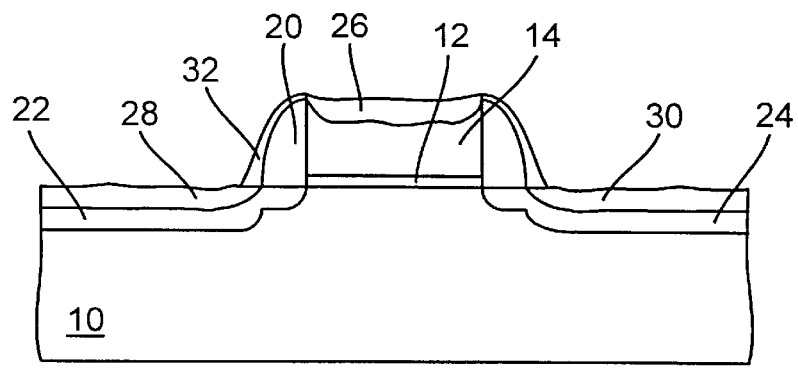
FIG. 6 - PRIOR ART

SALICIDE FORMATION PROCESS

This application is a continuation application of Ser. No. 09/073,861 filed on May 7, 1998, now U.S. Pat. No. 6,022,295 based on Provisional Application 60/051,702, filed on Jul. 3, 1997.

BACKGROUND OF THE INVENTION

1. Field of the Invention

The present invention relates to the fabrication of semiconductor devices incorporating structures including of a layer of polysilicon covered by a self-aligned layer of metal silicide.

2. Description of the Related Art

As line widths and geometries for semiconductor devices are made smaller, the polysilicon electrodes that form the gates of MOS devices and wiring lines within semiconductor devices become undesirably resistive. Multilayer electrodes in which a layer of polysilicon is covered by one or more layers of metals or metal silicides are used to provide electrodes having a lower resistance than electrodes consisting solely of polysilicon. Silicide electrodes may consist, for example, of a layer of polysilicon having a thickness of approximately 1000 Å to 3000 Å covered by titanium silicide or another metal silicide having a thickness of greater than 100 Å. The silicide layer provided on the polysilicon layer acts as a lower resistance conduction path in parallel with the polysilicon layer over the entire length of the gate electrode.

A typical implementation of a multilayer, silicide on polysilicon electrode is the so-called self-aligned silicide ("salicide") structure, aspects of which are illustrated schematically in FIGS. 1–6. The illustrated MOS devices are formed on a P-type substrate 10 which includes, for example, thick field oxide regions to provide isolation from other, adjacent MOS devices. As is conventional, the device isolation structures may be formed by a local oxidation of silicon (LOCOS) process or one of the modified LOCOS processes. Often, however, device isolation is provided by a shallow trench structure formed by etching a trench into the substrate and refilling the trenches with a deposited insulator, such as an oxide provided by chemical vapor deposition (CVD). A gate oxide layer 12 is formed by thermal oxidation over the active device region between the device isolation structures and a polysilicon gate electrode 14 is formed on the gate oxide layer 12. The polysilicon gate electrode 14 is formed by depositing a layer of undoped polysilicon over the substrate, typically using low pressure chemical vapor deposition (LPCVD), s implanting impurities into the polysilicon and annealing to activate the impurities and to render the polysilicon conductive. The polysilicon layer is patterned using conventional photolithography. Polysilicon wiring lines are typically formed elsewhere on the integrated circuit device at the same time and in the same maimer as gate electrode 14 is formed.

Doped source/drain regions 16, 18 are formed on either side of the polysilicon gate electrode to define the channel region of the illustrated MOS field effect transistor. Often, a lightly doped drain (LDD) structure is used in small design rule MOS transistors of the type that are frequently used in modern memory and logic devices. LDD source/drain regions are typically formed in a two step process, beginning with a relatively low level ion implantation made self-aligned to polysilicon gate electrode 14 to form the structure illustrated in FIG. 1. Subsequently, insulating sidewall spacer structures 20 (FIG. 2) are formed on either side of the gate electrode by first depositing a layer of CVD oxide over the FIG. 1 structure and then anisotropically etching back the oxide layer to expose the substrate over the lightly doped source/drain regions 16, 18. Etching back the CVD oxide layer produces the spacer oxide structures 20 on either side of the polysilicon gate electrode 14. After the spacer oxide regions 20 are provided on either side of the polysilicon gate electrode 14, a second, heavier ion implantation is made into the source/drain regions 22, 24 self-aligned to the spacer oxide regions 20.

For smaller line widths, even highly doped polysilicon is sufficiently resistive to diminish the performance of MOS and other types of integrated circuits which include polysilicon electrodes or which otherwise incorporate polysilicon electrodes because the resistivity of the polysilicon reduces signal levels and produces longer RC time constants in the associated circuits. To reduce the resistance of conventional polysilicon gate electrodes, further processing of the FIG. 2 device continues to convert the polysilicon gate electrode into a silicide structure using self-aligned silicide (salicide) techniques. Although a variety of different suicides are known to be acceptable, the silicide most commonly used at this time is titanium silicide, and that structure is described herein Referring now to FIG. 3, the salicide structure is formed on the polysilicon electrodes and the source/drain regions within the substrate by first sputtering a layer 25 of titanium over the surface of the device to a thickness of, for example, 500 Å. This titanium layer 25 is converted into titanium silicide at the surface of the polysilicon gate electrodes and at the exposed portions of the substrate, including the source/drain regions 22, 24, in a two step annealing process. In the first process step, the device is subjected to a rapid thermal anneal (RTA) by heating the device to a temperature of up to about 700° C. for about thirty seconds. The first RTA process is followed by an etch to remove unreacted portions of the titanium layer, leaving behind the titanium silicide, and then the titanium silicide is further processed in a second RTA process to achieve a desired form of the titanium silicide layers. The first RTA step of the process converts the titanium layer into titanium silicide (nominally $TiSi_2$) where the titanium layer is in contact with a silicon (crystalline or polycrystalline) surface during the anneal. A layer of titanium silicide 26 is formed over the polysilicon gate electrode 14 and titanium silicide regions 28, 30 are formed over the source/drain regions 22, 24 exposed during the silicidation process, as illustrated in FIG. 4. Titanium silicide regions 28, 30 over the source/drain regions 22, 24 are often preferred, particularly for logic devices, because silicided source/drain regions provide lower sheet resistance within the source/drain regions and provide better contacts to the source/drain regions 22, 24 than polysilicon. Silicided contacts on the source/drain regions are preferred so long as the amount of silicon consumed in the silicidation process does not alter the transistor performance or result in excessive junction leakage at the source/drain regions.

After the initial RTA step, the surface of the device is subjected to a wet etch consisting of $H_2O_2$ and $NH_4OH$ diluted in water to remove unreacted titanium and a variety of undesired titanium compounds from the surface of the device and to expose the oxide regions 20 of the device, as illustrated in FIG. 5. After the unreacted titanium is removed from the device, further processing is necessary to provide suitable silicide layers on the gate electrodes and over the source/drain regions. The titanium silicide formed in the first annealing step described above (RTA at about 700° C. for 30 sec.) is a relatively high resistivity metastable phase (known as the "C-49" phase) of titanium silicide on the silicon surfaces, that does not have as low of resistivity as is desirable. It is accordingly necessary to expose the device to a second annealing step at a temperature in excess of 800° C. for at least ten seconds in order to convert the higher resistivity C-49 phase of titanium silicide to the lower resistivity orthogonal phase (known as the "C-54" phase) of titanium silicide. The device is then subjected to further processing to complete fabrication.

A number of the processing steps necessary to the formation of salicide structures according to the above method are critical. If the temperature control is poor for the initial RTA step of converting the titanium in contact with silicon to titanium silicide, e.g., the temperature for the initial anneal is near 800° C., then it is possible for rapid silicon transport laterally through the titanium layer, which could convert titanium to titanium silicide in undesirable regions spaced away from the silicon surfaces. For example, if the temperature in the initial anneal is close to 800° C., silicon is transported along the portion of the titanium layer extending over the oxide spacers 20 on either side of the gate electrode 14 and "stringers"32 may be formed bridging between the gate silicide layer 26 and the source/drain silicide regions 28, 30, as illustrated in FIG. 6. The formation of stringers 32 is obviously undesirable in that the stringers short the gate to the source/drain regions and render the transistor inoperative. The high speed at which titanium is transported through polysilicon at the annealing temperatures required to obtain the low resistivity C-54 phase of titanium silicide mandates that the two step process described above be employed.

Experimental results have shown that the process used in forming salicide films described above often produces contact having an undesirably high contact resistance and with a process yield of low resistance electrodes that is undesirably low. It is believed that these problems are cause by interactions between the titanium layer and nitrogen gas present during the two annealing steps.

A method directed to improve process latitude and process yields is proposed in U.S. Pat. No. 4,923,822 to Wang, et al. The described method proceeds by first depositing a titanium layer over the source, drain and gate regions of a partially completed MOSFET. A layer of titanium nitride is then provided by reactive sputtering, i.e., by sputtering titanium in a chemically reactive environment including, for example, ammonia, to form a capping layer over the previously deposited titanium layer. The process of the Wang patent continues by annealing the device at a relatively low temperature to form titanium silicide adjacent where the deposited titanium layer is in contact with the source, drain and gate regions of the FET. Other portions of the deposited titanium layer are converted to titanium nitride which achieves a composition similar to the already present, reactively sputtered titanium nitride layer. After the first annealing step, the Wang patent's method proceeds by etching the titanium nitride from the device and then annealing to produce titanium silicide at selected surfaces of the device.

While the Wang patent can produce low resistivity electrodes, the yields of the process are unreliable. In addition, it becomes increasingly difficult using conventional methods to form acceptable low resistivity salicide electrodes when these structures are made using polysilicon lines that are less than one half micron across. It is accordingly desirable to develop better processing techniques for forming low resistance salicide structures.

BRIEF DESCRIPTION OF THE DRAWINGS

Embodiments of the present invention are described with reference to the accompanying drawings which, for illustrative purposes, are schematic and are not drawn to scale, where:

FIGS. 1–6 illustrate process steps for forming a salicide structure and aspects of failure mechanisms that may arise in salicide processing.

SUMMARY OF THE PREFERRED EMBODIMENTS

Figure 7:
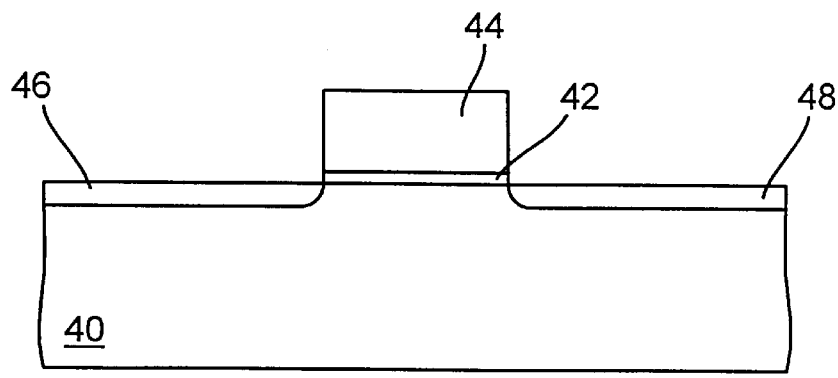
FIGS. 7–11 illustrate stages in the manufacture of MOS devices incorporating salicide structures in accordance with embodiments of the present invention.
Figure 8:
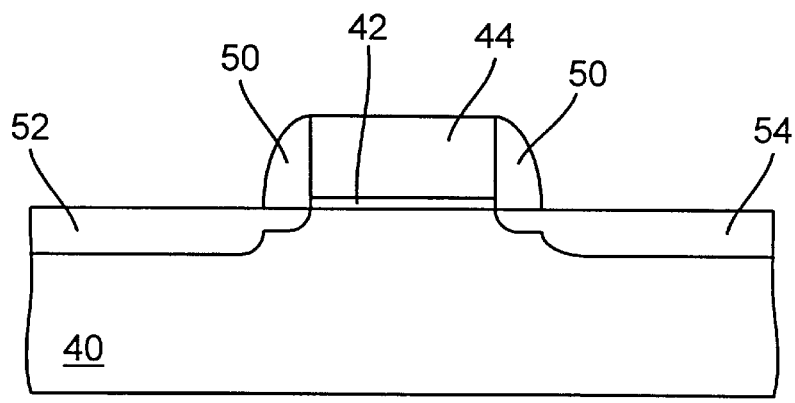

One embodiment of the present invention relates to a method of forming a self-aligned silicide structure including forming a structure including a layer of titanium over a gate electrode and over source/drain regions in a substrate. Direct sputtering is used-to deposit a layer of titanium nitride over the layer of titanium using a titanium nitride target material. The structure is annealed at a first temperature to form titanium silicide on the polysilicon gate electrode and titanium silicide on the source/drain regions, and the titanium nitride is removed from the structure.

Other embodiments relate to a method of making a semiconductor device including a MOS transistor. An insulator is formed on a semiconductor substrate and a gate electrode formed on the insulator. Source/drain regions are formed within the substrate on either side of the gate electrode. A layer of titanium is direct sputtered the semiconductor device, and a layer of nitride is direct sputtered over the titanium layer. The device is annealed at a first temperature to form a structure including titanium silicide on the polysilicon electrode, titanium silicide on the surface of the source/drain regions, unreacted titanium over the silicide regions, and titanium nitride over the unreacted metal. The unreacted titanium and titanium nitride are removed from the structure, and the structure is annealed at a higher temperature than the first temperature to form a lower resistivity titanium silicide.

In another aspect of embodiments of the present invention, the substrate is held at a temperature of about 300° C. during the direct sputtering of the titanium layer and the direct sputtering of the titanium nitride layer. In still another aspect of embodiments of the present invention, the substrate is held at approximately room temperature during the direct sputtering of the titanium layer and the direct sputtering of the titanium nitride layer.

DETAILED DESCRIPTION OF THE PREFERRED EMBODIMENTS

As discussed above in the Background, it is known to form FETs incorporating a salicided gate electrode by first depositing a titanium layer and then depositing a layer of titanium nitride over the titanium layer by reactive sputtering. This process proceeds through two annealing steps, with the titanium nitride layer etched off after the first annealing step. The present inventors have observed that such a process produces unreliable results, with an unacceptably high occurrence of overly resistive gate electrodes and source/drain contacts. The present inventors have observed that the reactive sputtering process used to provide the titanium nitride layer necessarily exposes the previously deposited titanium layer to a reactive nitrogen environment. This nitrogen environment is particularly reactive because of the high level of excitation provided by the plasma of the sputtering environment. As a consequence of this nitrogen "contamination," the titanium silicide/silicon interface formed in this process is often undesirably rough. In addition, it has been observed that it is more difficult to convert the titanium silicide layer to its low resistivity phase when the deposited titanium layer is "prereacted" with the reactive nitrogen environment Embodiments of the present invention include a new salicide (self-aligned silicide) fabrication process which protects the titanium layer that is partially converted to titanium silicide from "prereaction" with chemically active species during salicide processing. Embodiments of the invention successively provide a sputtered layer of titanium (Ti) and directly sputter a layer of titanium nitride (TiN) onto the unreacted titanium layer prior to the first RTA step. The TiN is preferably deposited using direct sputtering from a TiN target, so that an atmosphere that does not include reactive nitrogen is preferably maintained until the titanium layer is covered with an impermeable layer. The present inventors believe that the TIN layer directly sputtered in this way prevents the titanium layer from reacting with the $N_2$ or $NH_3$ gases during processing, which results in a higher quality titanium silicide film with a more uniform interface between the titanium silicide and the underlying silicon. This higher quality titanium nitride film is more readily converted into the desired low resistivity titanium silicide.

A typical implementation of a salicide structure according to certain preferred embodiments of the present invention is described below with reference to FIGS. 7–11. As illustrated in FIG. 7, a MOSFET device formed on a P-type substrate 40 has a gate oxide layer 42 formed by thermal oxidation over the active device region of the substrate. A polysilicon gate electrode 44 is formed on the gate oxide layer 42. The polysilicon gate electrode 44 may be formed by depositing a layer of undoped polysilicon over the substrate, typically using low pressure chemical vapor deposition (LPCVD). Impurities are implanted into the polysilicon and a the gate electrode annealed to activate the impurities and to render the polysilicon conductive.

Doped source/drain regions 46, 48 are formed on either side of the polysilicon gate electrode to define the channel region of the illustrated MOS transistor. Generally, a lightly doped drain (LDD) structure is used in small design rule MOS transistors of the type that are frequently used in modern memory and logic devices. LDD source/drain regions are typically formed in a two step process, beginning with a relatively low level implantation of dopants made self-aligned to polysilicon gate electrode 44 to form the structure illustrated in FIG. 7. Subsequently, insulating sidewall spacer structures 50 (FIG. 8) are formed on either side of the gate electrode by first depositing a layer of CVD oxide over the FIG. 7 structure and then anisotropically etching back the oxide layer to expose the substrate over the lightly doped source/drain regions 46, 48. Etching back the CVD oxide layer produces the spacer oxide structures 40 on either side of the polysilicon gate electrode 34. After the spacer oxide regions 40 are provided on either side of the polysilicon gate electrode 34, a second, heavier ion implantation is made into the source/drain regions 52, 54 self-aligned to the spacer oxide regions 50.

Figure 9:
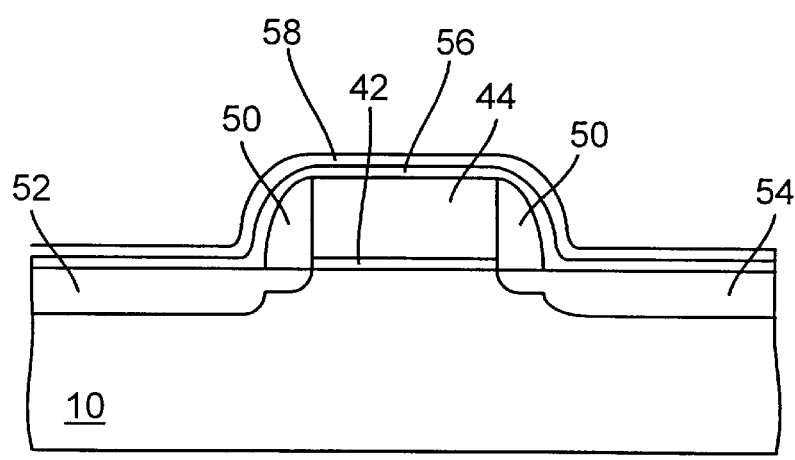

Referring now to FIG. 9, the silicide structure is formed on the polysilicon electrodes and select portions of the substrate by first sputtering a layer 56 of titanium over the surface of the device to a thickness of approximately 400 Å. Next, a layer 58 of titanium nitride is formed over the titanium layer 56, most preferably by direct sputtering from a titanium nitride target. Direct sputtering enables the titanium nitride to be deposited over the titanium layer without exposing the titanium layer to reactive nitrogen in the form of $N_2$ or $NH_3$. Preferably, the titanium nitride is deposited to a thickness of approximately 100 Å or greater, more preferably about 200–400 Å, with the substrate held at a temperature of approximately 300° C. during the titanium nitride sputtering in particularly preferred embodiments of the invention. After forming the titanium nitride layer over the titanium layer, the device is subjected to a first rapid thermal anneal (RTA) at a temperature within the range of about 620–750° C., for 10 to 120 seconds. More preferably, the first RTA is performed at about 700° C. for about 20–60 seconds. The first RTA may be carried out in an atmosphere such as, for example, $N_2$ or $NH_3$ without affecting the underlying titanium or titanium silicide layer because the directly sputtered titanium nitride layer effectively prevents the atmosphere from reaching the underlying titanium layer in a sufficient quantity to significantly alter the titanium silicide layer.

Figure 10:
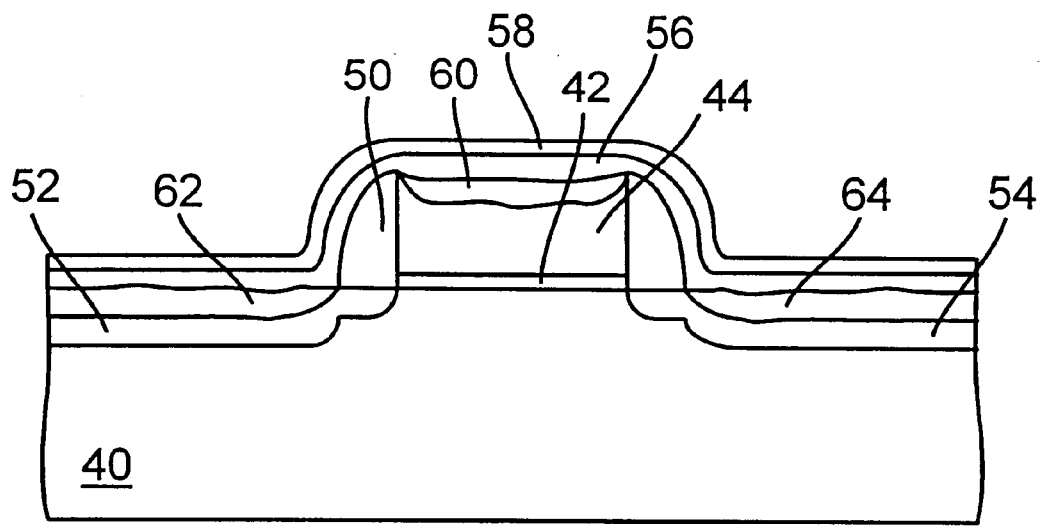
Figure 11:
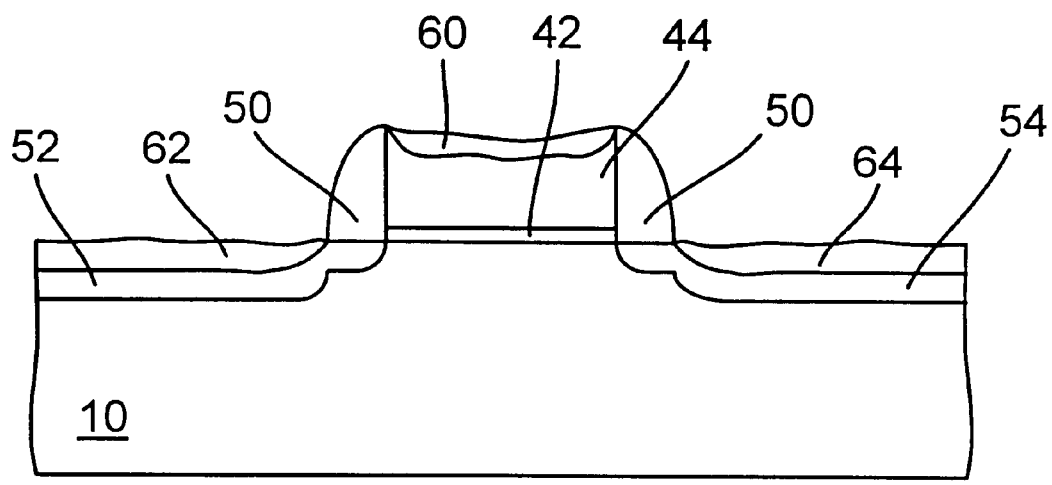

Titanium silicide layers 60, 62 and 64 are formed over gate oxide 44 and source/drain regions 52, 62 as seen in FIG. 10, with unreacted titanium 56 and the titanium nitride layer 58 remaining above the silicide layer. The unreacted titanium 56 and the titanium nitride layer 58 are then removed using an RCA solution including $NH_4OH$, $H_2O_2$, and $H_2O$ (for example, at a ratio of 1:1:5 at 60° C.), leaving a titanium silicide layer 60 over the gate electrode 44 and titanium silicide layer 62, 64 over the source/drain regions 52, 54, as seen in FIG. 11. The device is then subjected to a second RTA in $N_2$ or $NH_3$ gas at a temperature within a range of about 750–900° C. for between about 10–60 seconds. More preferably, the second RTA is performed at a temperature of about 850° C. for about 20 seconds. The second RTA may be carried out in an atmosphere such, for example, $N_2$ or $NH_3$. The second RTA causes at least a portion of the titanium silicide to transform from the higher resistivity, metastable C-49 phase to the lower resistivity, orthogonal C-54 phase.

The present inventors believe that that reactions between the $N_2$ or $NH_3$ gas and the titanium layer can lead to difficulties in obtaining low sheet resistance and uniform titanium salicide layers with narrow line widths using the conventional salicide processes. Direct sputtering of the titanium nitride layer means that the titanium nitride is sputtered using a titanium nitride target in an atmosphere in which the presence of nitrogen gas (or other gases which include nitrogen such as $NH_3$) is kept as low as is practicable in order to minimize interactions between the titanium layer and nitrogen gas species. Argon is an example of a preferred atmosphere for use during the direct sputtering of the titanium nitride layer. Once deposited, the titanium nitride layer acts as a protective, substantially impermeable layer over the titanium layer and underlying silicon.

Table 1 shows normalized contact resistance values for samples prepared with sputtered titanium and directly sputtered titanium nitride layers provided prior to the first annealing step according to embodiments of the present invention, versus samples prepared with only a sputtered titanium layer (no titanium nitride capping layer) prior to the first annealing step of the salicide process. Measurements were made for significant numbers of MOS transistors at the source/drain regions and at the gate electrode region. The results indicate that the devices having titanium nitride layers result in significantly lower resistances than salicide samples having only a titanium layer over the FET during the initial anneal.

TABLE 1

Contact resistance values (ohms)

| Contact resistance | TiN/Ti layers | Ti layer |
|---|---|---|
| $R_c$ (N+ region) | 0.873 | 1.654 |
| $R_c$ (P+ region) | 1.74 | 2.182 |
| $R_c$ (gate electrode region) | 1.36 | 2.068 |

In another aspect of embodiments of the present invention, it has been found that quality salicide layers have been formed when the substrate is kept at room temperature during the titanium and titanium nitride sputtering steps prior to the first RTA step. Quality salicide layers are more consistently formed when the substrate is heated to an elevated temperature during the titanium and titanium nitride sputtering steps. Particularly preferred embodiments hold the substrate at a temperature of 300° C. during the titanium and titanium nitride sputtering steps.

Figure 12:
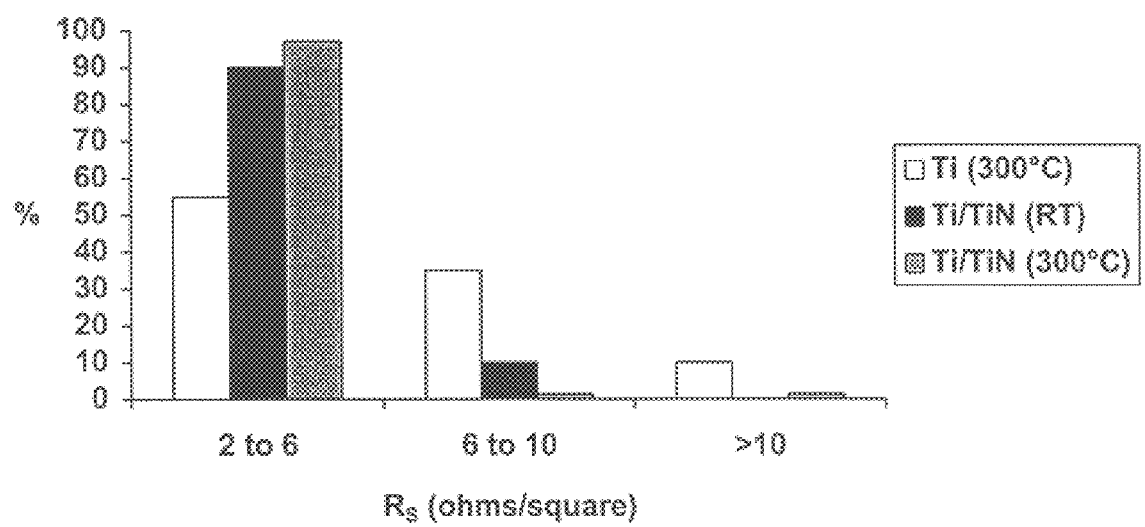
FIGS. 12–14 illustrate the percentage of devices having certain resistance ranges for devices fabricated using different methods including embodiments of the present invention
Figure 13:
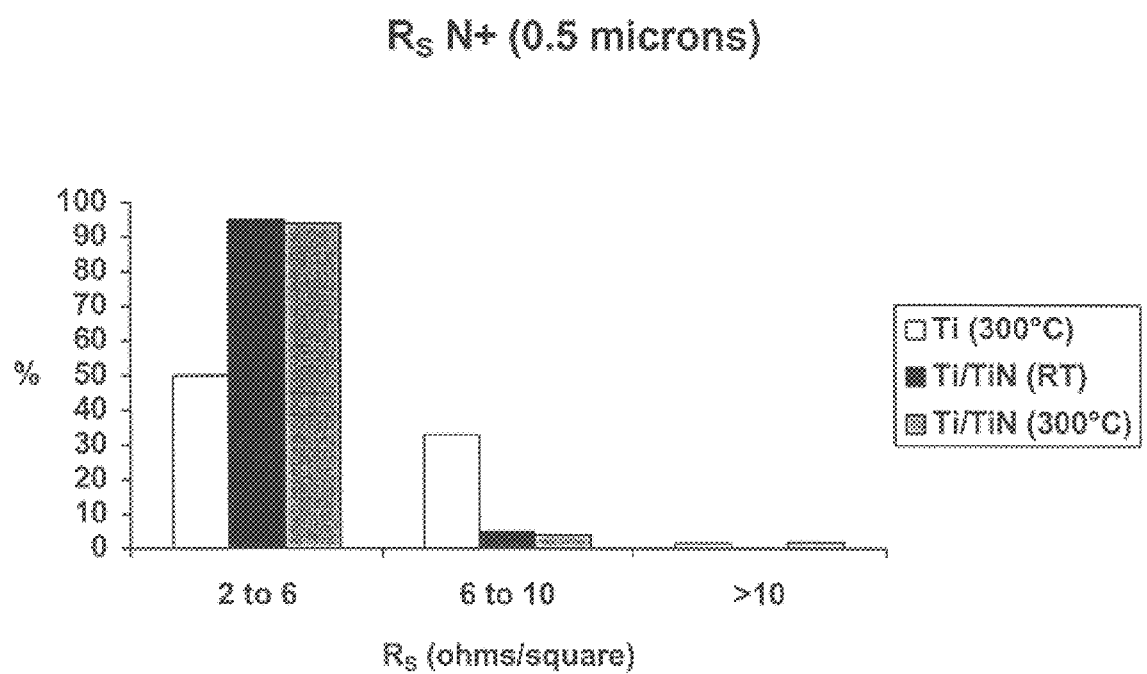
Figure 14:
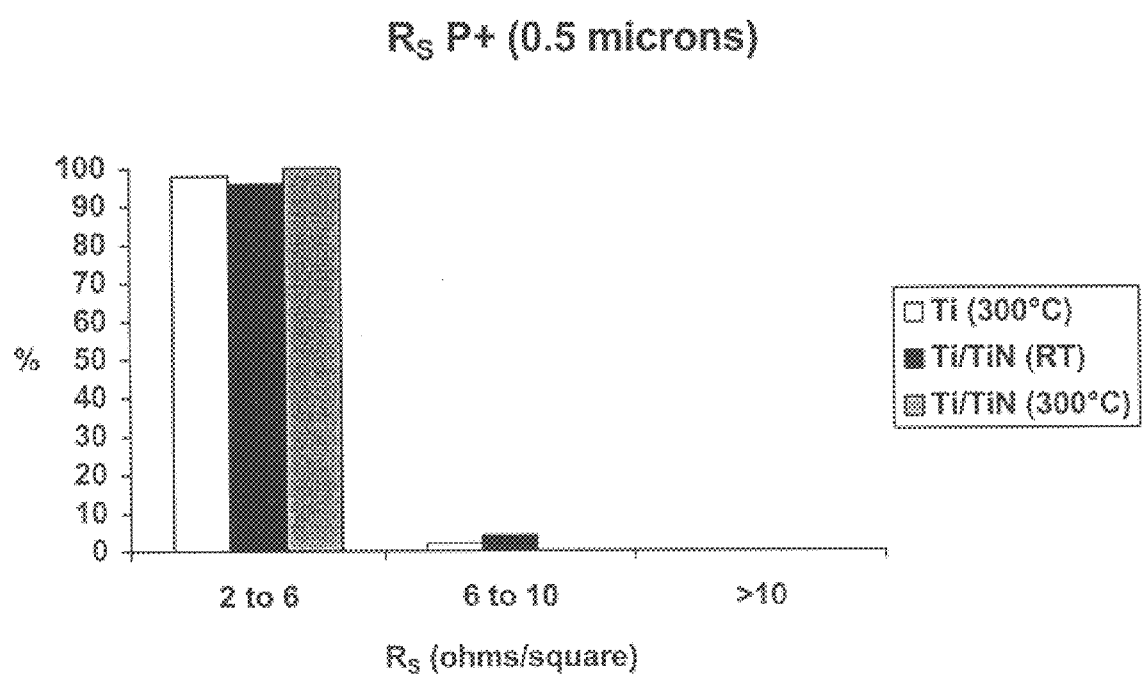

FIGS. 12–14 illustrate the percentage of samples having resistance values within the ranges of 2–6, 6–10, or greater than 10 ohms per square for source, drain and gate electrode regions, for samples that were fabricated with (1) a Ti layer sputter deposited with the substrate held at 300° C. and no TiN layer, (2) Ti and TiN layers sputter deposited with the substrate at room temperature, and (3) Ti and TiN layers sputter deposited with the substrate held at 300° C. The N+ and P+ regions were 0.5 microns wide and the gate electrode regions were 0.35 microns wide. The samples were subjected to two RTA treatments, with the unreacted nitride and metal removed prior to the second RTA treatment FIG. 12 illustrates that the gate electrode region of devices having directly sputtered Ti and TiN layers showed a significantly larger percentage of acceptable resistance measurements of between 2–6 ohms/square than the gate electrode region of devices having only a Ti layer deposited at 300° C. Similar results were obtained for the N+ region, with the devices having Ti and TiN layers showing a significantly higher percentage of measurements in the 2–6 ohms/square range than the devices having only a Ti layer deposited at 300° C., as illustrated in FIG. 12. The N+ regions showed all three types of samples having very high percentages of measurements in the 2–6 ohm/square range, as illustrated in FIG. 13. As seen from the data from FIGS. 12–14, it is apparent that devices fabricated according to embodiments of the present invention permit the sputtering of the Ti and TiN layers to be carried out at either room temperature or at elevated temperatures, although the elevated substrate deposition temperature provides the most consistent gate and source/drain characteristics. This provides added flexibility in the fabrication process.

In another aspect of the present invention, the present inventors have observed that the interface between the $TiSi_2$ layer and the underlying silicon formed using conventional processing steps has a rough texture. By forming the salicide layers according to preferred embodiments of the present invention, including the use of directly sputtered titanium nitride, it has been found that the interface between the salicide layer and the silicon has a more uniform and smooth texture. It is believed that the smooth textured junction formed in embodiments of the present invention contributes to a smaller junction leakage current than the rough textured junction formed in using conventional methods.

While the present invention has been described with particular emphasis on certain preferred embodiments, those of ordinary skill will appreciate that various modifications and alterations to the described embodiments can be made without altering the basic function of the present invention.

The scope of the invention is not limited to the particular embodiments described herein; rather, the scope of the present invention is to be determined by the following claims.

What is claimed:

1. A method of forming a self-aligned silicide structure comprising the steps of:

providing a substrate with a polysilicon gate and having a source/drain region formed thereon, to form a structure;

forming a layer of refractory metal over the polysilicon gate structure;

direct sputtering a layer of refractory metal-nitride over the layer of refractory metal using a refractory metal-nitride target material and in a nitrogen-free atmosphere;

annealing the structure at a first temperature to form metal-silicide on the polysilicon gate electrode and metal-silicide on the source/drain regions; and removing the layer of refractory metal-nitride from the structure.

2. The method of claim 1, wherein a layer of unreacted refractory metal remains in the structure after annealing the structure at the first temperature and prior to the step of removing the layer of refractory metal-nitride from the structure.

3. The method of claim 1, further comprising the step of removing any unreacted refractory metal from the structure after the annealing step.

4. The method of claim 3, further comprising the step of annealing the structure at a second temperature after removing the layer of refractory metal-nitride and any unreacted refractory metal, wherein the second temperature is greater than the first temperature.

5. The method according to claim 1, wherein the direct sputtering of the layer of refractory metal-nitride is carried out with the substrate held at a temperature of approximately 300° C.

6. The method of claim 1, wherein the substrate is held at a temperature of approximately 300° C. during the formation of the layer of refractory metal-nitride.

7. The method of claim 1, wherein the refractory metal is titanium.

8. The method of claim 1, wherein the refractory metal-nitride is titanium nitride.

9. The method of claim 8, wherein the refractory metal-nitride target material is titanium nitride.

10. The method of claim 8, wherein the substrate is held at a temperature of approximately 300° C. during the direct sputtering of the layer of titanium nitride.

11. The method of claim 8, wherein the substrate is held at approximately room temperature during the direct sputtering of the layer of titanium nitride.

12. The method of claim 8, wherein the layer of refractory metal-nitride is approximately 100 Å thick.

13. The method of claim 1, wherein the layer of refractory metal comprises a titanium layer, the layer of refractory metal-nitride comprises a titanium nitride layer and the target refractory metal-nitride material comprises titanium nitride.

14. The method of claim 1, wherein the substrate is held at a temperature of approximately 300° C. during the direct sputtering of the layer of refractory metal-nitride.

15. The method of claim 1, wherein the direct sputtering of the layer of refractory metal-nitride is carried out with the substrate held at approximately room temperature.

16. The method of claim 1, wherein the polysilicon gate has a spacer on a sidewall thereof.

* * * * *